(12) United States Patent
Zhao et al.

(10) Patent No.: US 10,818,491 B2
(45) Date of Patent: Oct. 27, 2020

(54) FORMATION OF A III-N SEMICONDUCTOR STRUCTURE

(71) Applicant: IMEC VZW, Leuven (BE)

(72) Inventors: Ming Zhao, Bertem (BE); Weiming Guo, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/423,274

(22) Filed: May 28, 2019

(65) Prior Publication Data

US 2019/0362967 A1    Nov. 28, 2019

(30) Foreign Application Priority Data

May 28, 2018 (EP) .................................... 18174617

(51) Int. Cl.
*H01L 21/02* (2006.01)
*H01L 21/76* (2006.01)
(Continued)

(52) U.S. Cl.
CPC .... *H01L 21/02507* (2013.01); *H01L 21/0254* (2013.01); *H01L 21/0262* (2013.01);
(Continued)

(58) Field of Classification Search
CPC ...................... H01L 21/02507; H01L 29/0649
(Continued)

(56) References Cited

U.S. PATENT DOCUMENTS 9,233,844 B2    1/2016 Chen et al.
2007/0108456 A1 5/2007 Wong et al.
(Continued)

FOREIGN PATENT DOCUMENTS

JP    2011-216823    10/2011
WO    2016/196160 A1    12/2016

OTHER PUBLICATIONS

European Search Report, European Patent Application No. 18174617.3, dated Nov. 14, 2018, 13 pages.
(Continued)

*Primary Examiner* — Igwe U Anya
(74) *Attorney, Agent, or Firm* — McDonnell Boehnen Hulbert & Berghoff LLP

(57) ABSTRACT

According to an aspect of the present disclosure, there is provided a III-N semiconductor structure comprising: a semiconductor-on-insulator substrate; a buffer structure comprising a superlattice including at least a first superlattice block and a second superlattice block formed on the first superlattice block, the first superlattice block including a repetitive sequence of first superlattice units, each first superlattice unit including a stack of layers of AlGaN, wherein adjacent layers of the stack have different aluminum content, the second superlattice block including a repetitive sequence of second superlattice units, each second superlattice unit including a stack of layers of AlGaN, wherein adjacent layers of the stack have different aluminum content, wherein an average aluminum content of the second superlattice block is greater than an average aluminum content of the first superlattice block; and a III-N semiconductor channel layer arranged on the buffer structure.

13 Claims, 7 Drawing Sheets

(51) Int. Cl.
*H01L 29/06* (2006.01)
*H01L 29/15* (2006.01)
*H01L 29/20* (2006.01)
*H01L 29/66* (2006.01)
*H01L 29/778* (2006.01)

(52) U.S. Cl.
CPC .... *H01L 21/02458* (2013.01); *H01L 21/7605* (2013.01); *H01L 29/0649* (2013.01); *H01L 29/155* (2013.01); *H01L 29/2003* (2013.01); *H01L 29/66462* (2013.01); *H01L 29/7785* (2013.01)

(58) Field of Classification Search
USPC .......................................................... 257/20
See application file for complete search history.

(56) References Cited

U.S. PATENT DOCUMENTS

| | | | |
|---|---|---|---|
| 2011/0168979 A1 | 7/2011 | Shur et al. | |
| 2014/0042492 A1 | 2/2014 | Tak et al. | |
| 2014/0209862 A1* | 7/2014 | Ikuta | H01L 29/155 257/22 |
| 2015/0083994 A1* | 3/2015 | Jain | H01L 33/007 257/13 |
| 2015/0340230 A1* | 11/2015 | Ikuta | C30B 25/183 257/76 |
| 2015/0357419 A1* | 12/2015 | Lutgen | H01L 21/0254 257/22 |
| 2016/0359005 A1 | 12/2016 | Hu et al. | |
| 2017/0141263 A1* | 5/2017 | Yang | H01L 33/32 |
| 2017/0194476 A1 | 7/2017 | Brueck et al. | |
| 2017/0323960 A1 | 11/2017 | Sato et al. | |
| 2018/0212025 A1* | 7/2018 | Zhao | H01L 21/02458 |
| 2019/0109208 A1* | 4/2019 | Wang | H01L 29/7786 |

OTHER PUBLICATIONS

Tham, Wai Hoe et al., "Comparison of the AlxGa1-xN/GaN Heterostrutures Grown on Silicon-on-Insulator and Bulk-Silicon Substrates", IEEE Transactions on Electron Devices, vol. 63, No. 1, Jan. 2016, pp. 345-352.

Hageman, P.R. et al., "Growth of GaN Epilayers on Si(111) Substrates Using Multiple Buffer Layers", Mat. Res. Soc. Symp. Proc., vol. 693, 2002, pp. 1-6.

* cited by examiner

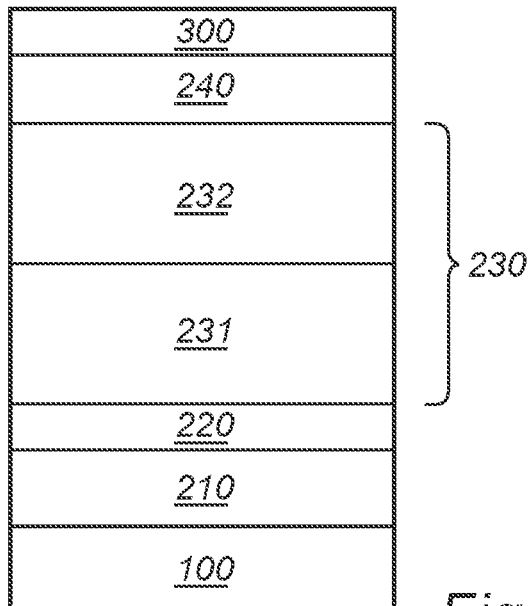
Fig. 4a
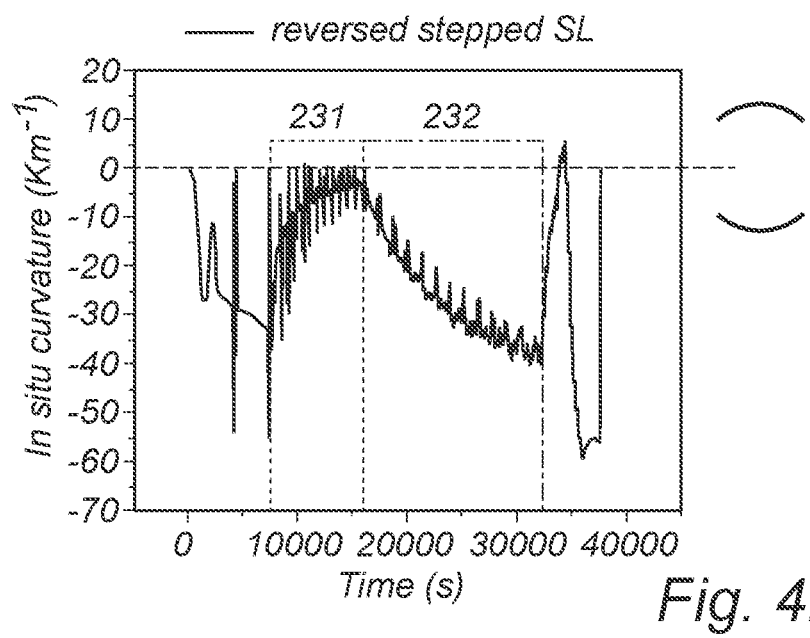
Fig. 4b
| Pre epi warp (μm) | | Post epi warp (μm) | |
|---|---|---|---|
| X | Y | X | Y |
| 18.5 | 18.1 | -192 | -200 |
Fig. 4c

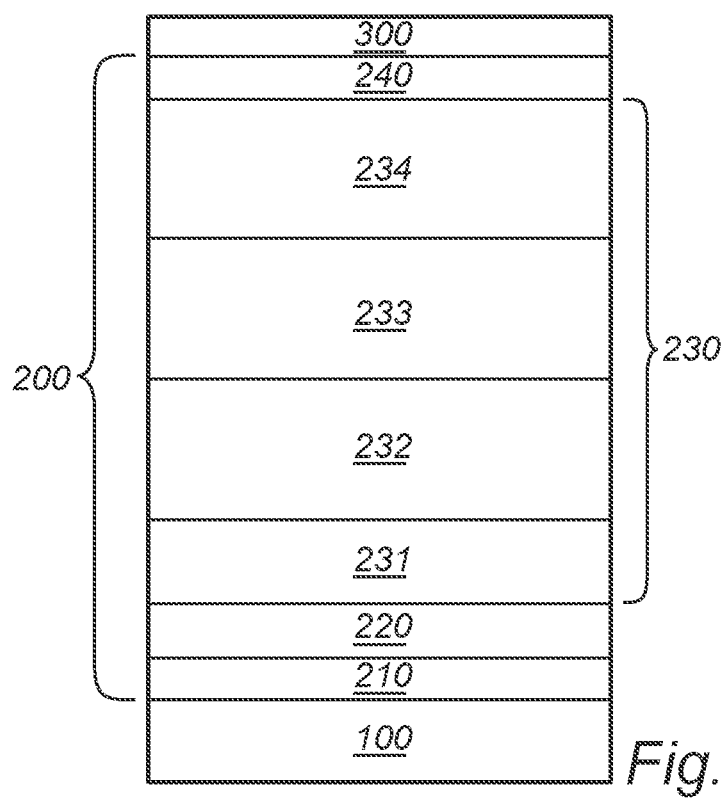
*Fig. 5a*
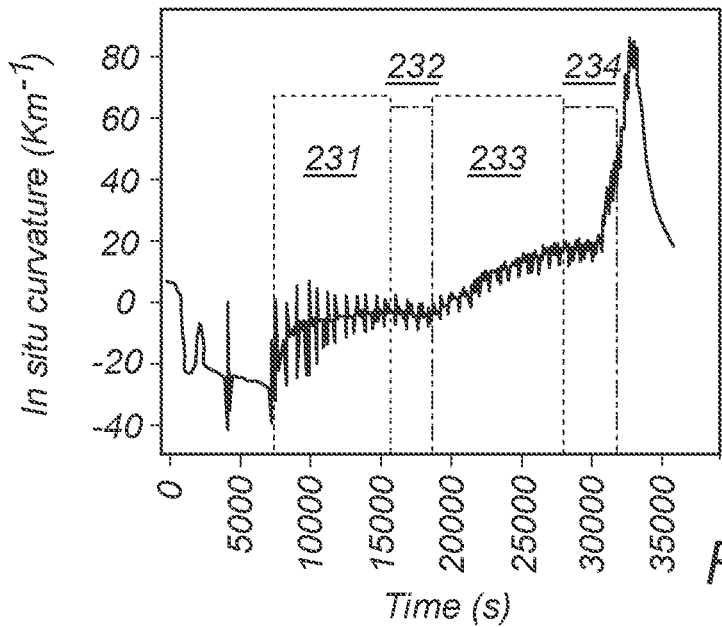
*Fig. 5b*
| Pre epi warp (μm) | | Post epi warp (μm) | |
|---|---|---|---|
| X | Y | X | Y |
| 22.9 | 20.1 | 50.6 | 64.3 |
*Fig. 5c*

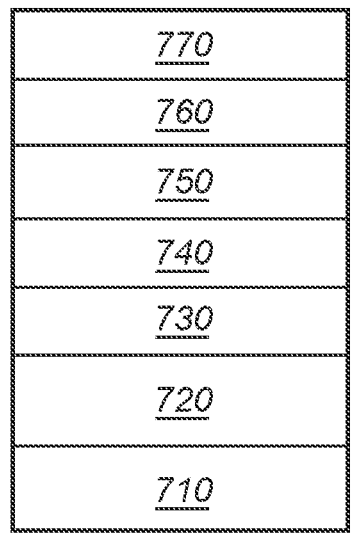
Fig. 7a
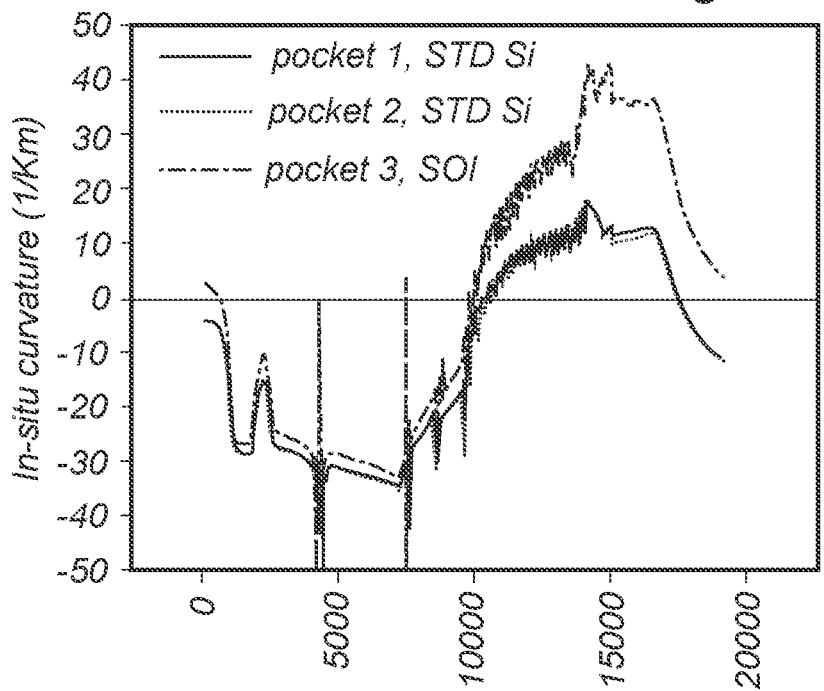
Fig. 7b
| Wafer type | Warp X (μm) | Warp Y (μm) |
|---|---|---|
| STD Si | -61.4 | -58.3 |
| SOI | -30.5 | -43.1 |
Fig. 7c

FORMATION OF A III-N SEMICONDUCTOR STRUCTURE

CROSS-REFERENCE TO RELATED APPLICATIONS

The present application is a non-provisional patent application claiming priority to European Patent Application No. 18174617.3, filed on May 28, 2018, the contents of which are hereby incorporated by reference.

FIELD OF THE DISCLOSURE

The present disclosure relates to a III-N semiconductor structure. The disclosure further relates to a method for forming a III-N semiconductor structure.

BACKGROUND

III-N semiconductors, such as gallium nitride (GaN), are promising candidates for fabrication of advanced semiconductor devices. III-N semiconductor devices are of particular interest for use in high power and high frequency applications. III-N based devices are typically grown by hetero-epitaxy on foreign substrates, for instance Si, sapphire, and SiC. Example epitaxy processes include metal organic vapor phase epitaxy (MOVPE) and molecular beam epitaxy (MBE).

To manage the stress induced by lattice and thermal mismatch between the substrate and the active III-N device layer(s), and thus enable growth of active layers with satisfactory material quality and electric properties, an intermediate buffer structure including a superlattice of multiple repetitions of bi-layers of $AlN/Al_xGa_{1-x}N$ may be used. In terms of leakage blocking capability between active layer and substrate, it is generally beneficial to form a comparably thick buffer. However, growing a thick buffer requires careful attention to in situ curvature in order to avoid plastic deformation of the substrate and also to compensate for thermal mismatch introduced concave wafer bowing during post-epitaxy cooling.

Currently, III-N based devices are commonly formed on substrates of Si, sapphire or SiC. However, it would be desirable to form III-N devices on semiconductor-on-insulator (SOI) type of substrates. A SOI substrate includes in a bottom-up direction, a bottom handling wafer (for instance of Si, Mo, or AlN), a buried oxide (BOX) and a top semiconductor layer (for instance Si, Ge, SiGe, or SiC).

Compared with the traditional bulk substrates, one special behavior of SOI substrates are their deformation response to lattice- and thermal-mismatch induced stress. Although still a subject of some debate, this phenomenon may be explained by "the strain partition effect" from which it follows that when the thickness of the semiconductor layer of the SOI-substrate is comparable to or less than the thickness of an epi-grown III-N layer or layer stack, a relatively large and even a major part of the introduced stress is accommodated by strain in the semiconductor layer of the SOI-substrate.

SUMMARY

Common III-N superlattice based buffer structures for growth on bulk substrates are typically designed to continuously introduce compressive stress during the growth and thus compensate for the thermal mismatch introduced tensile stress during post-epitaxy cooling. However, if such a buffer structure is grown on a SOI substrate having a thin semiconductor layer (compared to the thickness of the III-N layers), the much stronger wafer deformation during growth due to the strain partition effect may lead to difficulties to control the final wafer warp/bow even for III-N stacks with a comparably small thickness. Moreover, providing a sufficient leakage blocking capability may be more challenging since a thicker buffer structure may, due to the strain partition effect, result in plastic deformation (bowing) and cracking of the SOI substrate.

These challenges, at least partly, may be alleviated by the forming of thicker III-N based devices on SOI substrates.

According to an aspect of the present disclosure, there is provided a III-N semiconductor structure comprising: a semiconductor-on-insulator substrate; a buffer structure comprising a superlattice including at least a first superlattice block and a second superlattice block formed on the first superlattice block, the first superlattice block including a repetitive sequence of first superlattice units, each first superlattice unit including a stack of layers of AlGaN, wherein adjacent layers of the stack have different aluminum content, the second superlattice block including a repetitive sequence of second superlattice units, each second superlattice unit including a stack of layers of AlGaN, wherein adjacent layers of the stack have different aluminum content, wherein an average aluminum content of the second superlattice block is greater than an average aluminum content of the first superlattice block; and a III-N semiconductor channel layer arranged on the buffer structure.

Accordingly, the superlattice includes a pair of superlattice blocks formed by the first and the second superlattice block. The second superlattice block has an average aluminum content greater than an average aluminum content of the first superlattice block. This allows the pair of superlattice blocks to be provided to the III-N semiconductor structure during fabrication without introducing (further) compressive stress to the structure, or even providing tensile stress to the structure. The pair of superlattice blocks may thus during the epitaxy act to at least counteract further build-up of compressive stress, or even reduce pre-existing compressive strain in the structure. Hence the first and second superlattice blocks may be referred to as a "non-compressive stress inducing pair" of superlattice blocks.

This pair of superlattice blocks allows for the controlling the stress introduced in the structure, in particular the stress induced in the semiconductor-on-insulator substrate. This in turn allows the deformation of the semiconductor-on-insulator substrate during growth to be kept within a range to avoid plastic deformation. Accordingly, it becomes possible to grow a comparatively thick buffer structure providing increased leakage blocking capability.

As used herein, the notation "AlGaN" or "(Al)GaN" should be understood as referring to $Al_xGa_{1-x}N$, where $0 \leq x \leq 1$. Accordingly, a layer of AlGaN may be a semiconductor alloy of AlN and GaN in various proportions. However, a layer of AlGaN may also be a compound semiconductor of AlN (with no Ga-content) or GaN (with no Al-content). If the AlGaN/(Al)GaN notation is used for different layers, it should be understood that the different layers may present different compositions, i.e. different values of x.

A "superlattice" is a composite layer structure including a number of superlattice blocks, at least two superlattice blocks however more such as three, four or more is also possible.

A "superlattice block" is a composite layer structure including a superlattice unit repeated a number of times, at least two however more such as three, four or more is also possible. The superlattice units of each respective superlattice block may be identical to each other. I.e. the superlattice units of the first superlattice block are identical to each other and the superlattice units of the second superlattice block are identical to each other.

A "superlattice unit" is a composite layer structure including a stack or laminate of layers of AlGaN, wherein each of the layers of the stack have an aluminum content, i.e. a proportion of aluminum, which is different from an aluminum content of the adjacent layer(s) of the stack. Two layers may be said to be adjacent if they have a common interface.

By "average aluminum content" of a superlattice block is herein meant the proportion of aluminum in the superlattice block. Mathematically, an average aluminum content AL % of a superlattice block of two or more superlattice units of j layers of AlGaN, each layer j having a thickness $D_j$ and a composition of $Al_{xj}Ga_{1-xj}N$ may be expressed as $$AL\% = \frac{\Sigma xj * D_j}{\Sigma D_j} * 100\%$$

where the sums run over index j.

The semiconductor-on-insulator substrate may include a bottom wafer, a top semiconductor layer and an insulator layer intermediate the bottom wafer and the top semiconductor layer. The top semiconductor layer may form an active device layer. This may render the semiconductor structure for use in logic and/or or radio frequency (RF) circuitry. The buffer structure may be formed on the top semiconductor layer, or more specifically on an upper surface of the top semiconductor layer.

By a layer or block providing "compressive stress" to the structure is hereby meant that the layer or block experiences/is under compressive stress due to the lower layers of the structure. Conversely, by a layer or block providing "tensile stress" is hereby meant that the layer or block experiences/is under tensile stress due to the lower layers of the structure.

In the present disclosure, the term "curvature" of a structure (such as the SOI substrate, a superlattice block or a layer) will be used to refer the reciprocal of the radius of the structure. "In situ" curvature refers to curvature during the epitaxial growth of the III-N semiconductor structure. "Ex situ" warp refers to the wafer warp after completion of epitaxial growth and cooling of the III-N semiconductor structure.

A positive or convex curvature implies that the origin lies below the SOI substrate (as viewed in a layer stacking direction on the SOI substrate, i.e. normal to the SOI substrate). Conversely a negative or concave curvature implies the origin lies above the SOI substrate.

When a statement of a character of the curvature (e.g. convex/positive or concave/negative) is made, the curvature may exhibit this property in all positions along any path extending in a direction along the surface.

The superlattice of the buffer structure may include a plurality of superlattice blocks wherein the first and the second superlattice blocks may form an adjacent pair of superlattice blocks of the superlattice. Thus, the superlattice may include three superlattice blocks or more, of which the first and the second superlattice block form a pair or superlattice blocks formed in abutment with each other. A greater number of superlattice blocks provides an increased degree of freedom in tuning the buffer structure properties, among others for the purpose of controlling in situ curvature and post-epi wafer warp. Each superlattice block of the superlattice may include a repetitive sequence of superlattice units, each unit including a stack of layers of AlGaN, wherein adjacent layers of the stack have different aluminum content.

In particular, the superlattice may include an upper superlattice block formed above the second superlattice block and having an average aluminum content which is less than the average aluminum content of the second superlattice block. The upper superlattice block may be formed directly on top of the second superlattice block.

Alternatively or additionally, the superlattice may include a lower superlattice block formed below the first superlattice block and having an average aluminum content which is greater than the average aluminum content of the first superlattice block. The first superlattice block may be formed directly on top of the lower superlattice block (if present).

In the first case, the superlattice may include at least one upper superlattice block with a smaller average aluminum content than the second superlattice block. In the second case, the superlattice may include at least one lower superlattice block with a greater average aluminum content than the first superlattice block.

In either case, by gradually reducing the average aluminum content between at least two adjacent superlattice blocks, compressive stress may be introduced above or below the non-compressive stress inducing pair of first and second superlattice blocks. Compressive strain allows to compensate for tensile strain introduced post-epi due to thermal mismatch between the III-N semiconductor and a semiconductor layer of the SOI substrate.

According to one embodiment, the superlattice includes a third superlattice block formed on the second superlattice block and a fourth superlattice block formed on the third superlattice block, wherein an average aluminum content of the fourth superlattice block is greater than an average aluminum content of the third superlattice block, and wherein the average aluminum content of the third superlattice block is smaller than the average aluminum content of the second superlattice block. Hence, the superlattice may include superlattice blocks alternatingly introducing compressive and tensile stress to the structure. This provides an even greater freedom to control in situ curvature and post-epi wafer warp.

The average aluminum content of the fourth superlattice block may also be smaller than the average aluminum content of the second superlattice block.

The semiconductor-on-insulator substrate may include a bottom wafer, a top semiconductor layer and an insulator layer intermediate the bottom wafer and the top semiconductor layer, wherein a combined thickness of the buffer structure and the III-N semiconductor channel layer may be greater than a thickness of top semiconductor layer. Owing to the design of the superlattice of the buffer structure, a semiconductor structure with such a configuration and without excessive in situ curvature and post-epi wafer warp may be obtained.

Adjacent pairs of layers of one or more of the first and the second superlattice blocks may be pseudomorphic layers. By a pseudomorphic layer pair is hereby meant a pair of a lower layer and an upper layer wherein the (in-plane) lattice constant of the upper layer matches the (in-plane) lattice constant of the lower layer.

It is also possible to form the superlattice such that an at least partial strain relaxation is present in one or more of the first and the second superlattice blocks, between at least one adjacent pair of layers thereof.

The strain relaxation may be of any degree within a range of partial to full strain relaxation. By strain relaxation is hereby meant relaxation of the in-plane strain. Having an at least partial strain relaxation between two mutually abutting layers enables the buffer structure to be formed with a greater thickness: During growth of the buffer structure compressive strain may accumulate and an in situ curvature of the SOI-substrate may increase. If the in situ curvature is increased beyond a critical amount (the precise value being substrate specific) plastic deformation of the SOI substrate may occur. By having an at least partial strain relaxation in at least one superlattice block, the rate of increase of the in situ curvature may be reduced such that a thicker buffer layer structure may be formed without reaching the limit for plastic deformation.

The channel layer may include one or more layers of $B_x In_y Al_z Ga_w N$ ($0 \leq x \leq 1$, $0 \leq y \leq 1$, $0 \leq z \leq 1$, $0 \leq w \leq 1$, and $x+y+z+w=1$). The channel layer may be formed directly on top of the superlattice. However, if the buffer structure includes further layers such as one or more upper transitions layer, the channel layer may be formed directly on top of the upper transition layer(s).

The buffer structure may include an AlN nucleation layer formed on the semiconductor-on-insulator substrate.

The nucleation layer may form a bottom layer of the buffer structure. An AlN nucleation layer may prevent an eutectic reaction between a semiconductor layer of the SOI and Ga which may lead to the so-called "melt etch back" effect. The AlN nucleation layer may also facilitate epitaxial growth of the further material layers of the buffer structure.

The buffer structure may further comprise a lower transition layer of (Al)GaN, wherein the superlattice is formed on the lower transition layer. The lower transition layer may provide an additional flexibility in in situ wafer curvature and wafer warp control and also provide a foundation for higher material quality growth of the superlattice on top. The lower transition layer may be a single layer with a uniform composition or be a composite layer including two or more sub-layers of (Al)GaN with different compositions.

The buffer structure may further comprises an upper transition layer of (Al)GaN formed on the superlattice. The upper transition layer may provide an additional flexibility in in situ wafer curvature and wafer warp control and also provide a foundation for higher material quality growth of the channel layer on top. The upper transition layer may be a single layer with a uniform composition or be a composite layer including two or more sub-layers of (Al)GaN with different compositions.

According to a second aspect there is provided a method for forming a III-N semiconductor structure, the method comprising: forming, on a semiconductor-on-insulator substrate, a buffer structure, wherein forming the buffer structure comprises: forming a superlattice including at least a first superlattice block and a second superlattice block on the first superlattice block, wherein the first superlattice block is formed by epitaxially growing a repetitive sequence of first superlattice units, each first superlattice unit including a stack of layers of AlGaN, wherein adjacent layers of the stack have different aluminum content, wherein the second superlattice block is formed by epitaxially growing a repetitive sequence of second superlattice units, each second superlattice unit including a stack of layers of AlGaN, wherein adjacent layers of the stack have different aluminum content, wherein an average aluminum content of the second superlattice block is greater than an average aluminum content of the first superlattice block; and epitaxially growing a III-N semiconductor channel layer on the buffer structure.

The method generally presents the same or corresponding benefits as the first aspect. Reference is therefore made to the above discussion concerning merits of the first aspect.

Moreover, forming the superlattice may include forming a plurality of superlattice blocks and wherein the first and the second superlattice blocks form an adjacent pair of superlattice blocks of the superlattice. Each superlattice block of the superlattice may include a repetitive sequence of superlattice units, each unit including a stack of layers of AlGaN, each layer of the stack having a different aluminum concentration.

Forming the superlattice may include forming an upper superlattice block above the second superlattice block and having an average aluminum content which is less than the average aluminum content of the second superlattice block.

Forming the superlattice may include forming a lower superlattice block below the first superlattice block and having an average aluminum content which is greater than the average aluminum content of the first superlattice block.

Forming the superlattice may include forming a third superlattice block on the second superlattice block and a fourth superlattice block on the third superlattice block, wherein an average aluminum content of the fourth superlattice block is greater than an average aluminum content of the third superlattice block, and wherein the average aluminum content of the third superlattice block is smaller than the average aluminum content of the second superlattice block.

The semiconductor-on-insulator substrate may include a bottom wafer, a top semiconductor layer and an insulator layer intermediate the bottom wafer and the top semiconductor layer, and wherein the buffer structure and the III-N semiconductor channel layer are formed with a combined thickness greater than a thickness of top semiconductor layer.

According to the method, the second superlattice block may be formed such that a temporal rate of change of an in situ curvature of the second superlattice block is less than or equal to 0. The temporal rate of change (i.e. change over time) of the in situ curvature corresponds to a slope of in situ curvature as a function of growth time (or equivalently as a function of the thickness of the second superlattice block).

The superlattice may be grown such that an at least partial strain relaxation occurs between at least one adjacent pair of layers of the superlattice.

The afore-mentioned embodiments of the second aspect generally present the same or corresponding advantages as the corresponding embodiments of the first aspect. The further embodiments or variations of the first aspect are also correspondingly applicable to the second aspect. Reference is therefore made to the above discussion.

BRIEF DESCRIPTION OF THE FIGURES

The above, as well as additional, features will be better understood through the following illustrative and non-limiting detailed description of example embodiments, with reference to the appended drawings.

FIG. 4a is a III-N semiconductor structure, according to an example embodiment.

FIG. 4b shows an in situ wafer curvature and a post-epi wafer warp, according to an example embodiment.

FIG. 4c shows the pre- and post-epi wafer warp measured along two orthogonal directions along the wafer.

FIG. 5a is a III-N semiconductor structure, according to an example embodiment.

FIG. 5b shows an in situ wafer curvature, according to an example embodiment.

FIG. 5c shows the pre- and post-epi wafer warp measured along two orthogonal directions along the wafer.

FIG. 7a is a III-N semiconductor structure, according to an example embodiment.

FIG. 7b shows an in situ wafer curvature, according to an example embodiment.

FIG. 7c shows the pre- and post-epi wafer warp measured along two orthogonal directions along the wafer.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

A III-N semiconductor structure and a method of forming a III-N semiconductor structure will now be described with reference to FIGS. 1 through 3.

Figure 1:
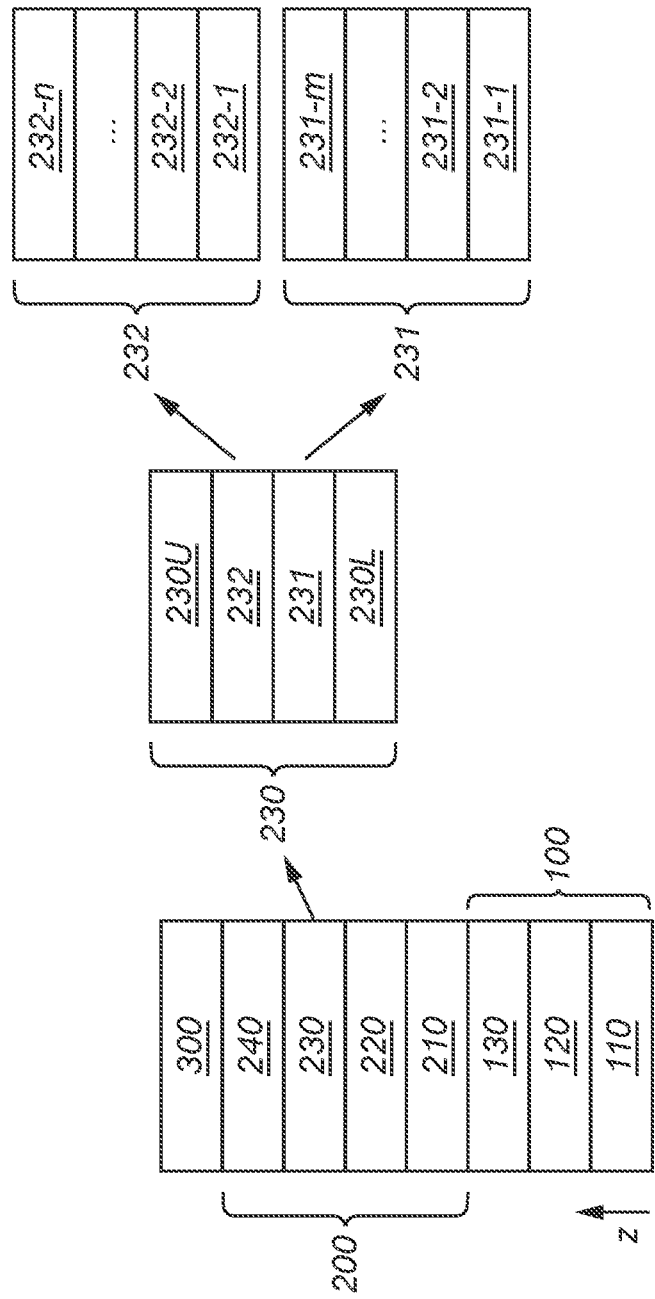
FIG. 1 schematically shows a III-N semiconductor structure, according to an example embodiment.

FIG. 1 shows in a schematic cross section a semiconductor structure comprising a stack of layers. The stacking direction of the layers is indicated by "Z" and may in the following also be referred to as a vertical direction, a bottom-up direction, or a normal direction to the SOI substrate. It should be noted that the relative dimensions of the shown elements, in particular the relative thickness of the layers, is merely schematic and may, for the purpose of illustrational clarity, differ from a physical structure.

The semiconductor structure includes in the bottom-up direction a semiconductor-on-insulator substrate 100 (hereinafter abbreviated SOI substrate 100), a buffer structure 200 and a III-N semiconductor channel layer 300.

The SOI substrate 100 includes a bottom wafer 110, a top semiconductor layer 130 and an insulator layer 120 intermediate the bottom wafer 110 and the top semiconductor layer 130. The SOI substrate 100 may be of any conventional type such as a monocrystalline Si, Ge, SiGe or SiC top layer 130 formed on an oxide insulator layer 120 and supported by a bottom handling wafer 110 of for instance Si, Mo or AlN. The top semiconductor layer 130 may present a {111} plane as an upper main surface. The SOI substrate 100 may be fabricated in a conventional manner such as a layer transfer process where a top semiconductor layer is bonded to a bottom wafer 110 by a bonding oxide layer 120 and subsequently cut or grinded to form the final thinned top semiconductor layer 130

The buffer structure 200 is formed on the SOI substrate 100. The buffer structure 200 includes in a bottom-up direction an AlN nucleation layer 210, a lower transition layer 220, a superlattice 230 and an upper transition layer 240. The lower transition layer 220 and the upper transition layer 240 are both optional layers and may be omitted.

The AlN nucleation layer 210 (hereinafter "the nucleation layer 210") is formed on and in contact with the upper surface of the SOI-substrate 100 (step 402 of the flow chart 400 of FIG. 3). The nucleation layer 210 may be epitaxially grown by vapor phase deposition, for instance MOCVD using conventional Al precursors such as trimethylaluminum (TMAl). However, some other conventional type of vapor deposition process suitable for epitaxial growth of an AlN nucleation layer is also possible. The nucleation layer 210 may be formed with a thickness of 250 nm or less, including at least 50 nm. The nucleation layer 210 may generally be formed with a thickness for reaching a sufficient crystalline quality for the growth of following layers. If a Si-based top semiconductor layer 130 is present, the nucleation layer 210 may also be formed with a thickness which is sufficient for counteracting diffusion of Ga to react with the top semiconductor layer 130. The nucleation layer 210 may be formed to present a C-plane as an upper main surface.

Figure 3:
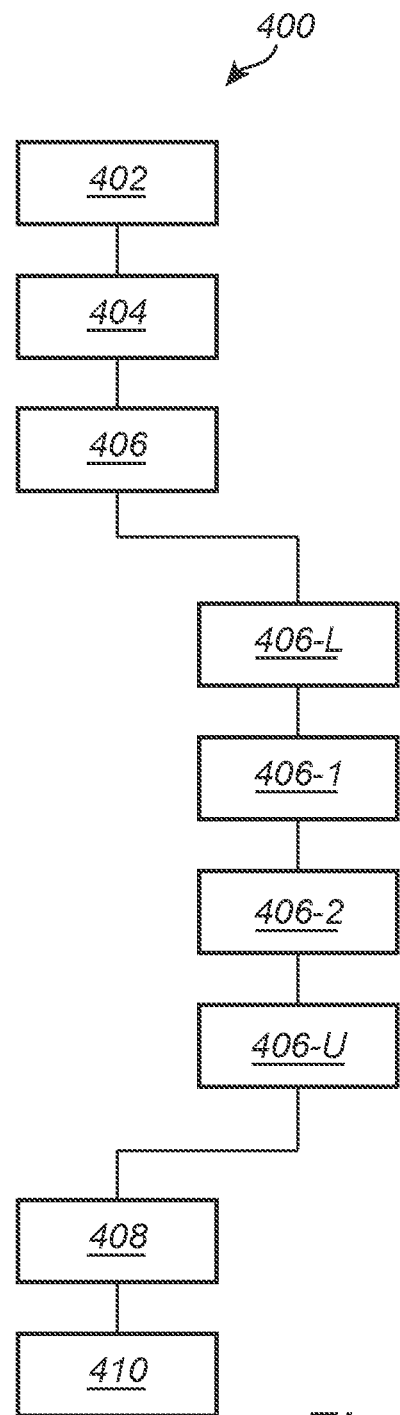
FIG. 3 is a flow chart of a method for forming a III-N semiconductor structure, according to an example embodiment.

The lower transition layer 220 is formed on and in contact with the upper main surface of the nucleation layer 210 (step 404 of FIG. 3). The lower transition layer 220 may be formed as a single layer with a uniform composition. For instance, the lower transition layer 220 may be an (Al)GaN layer having an Al content in the range of 20% to 90%. Alternatively, the lower transition layer 220 may be formed as a composite layer including two or more sub-layers of (Al)GaN with different compositions. The lower transition layer 220 may be formed to present a C-plane as an upper main surface.

The lower transition layer 220 may be epitaxially grown by vapor phase deposition, for instance MOCVD using conventional group III element precursors such as trimethylgallium (TMGa), triethylgallium (TEGa), and TMAl, or some other conventional type of vapor deposition process suitable for epitaxial growth of (Al)GaN, such as molecular beam epitaxy (MBE), physical vapor deposition (PVD) or hydride vapor phase epitaxy (HVPE). The lower transition layer 220 may be formed with a (total) thickness of 200 nm or less.

A superlattice 230 is formed by a number of superlattice blocks stacked on top of each other (step 406 of FIG. 3). In FIG. 1 the superlattice blocks include a first superlattice block 231 and second superlattice block 232 formed on top of the first superlattice block 231. As shown, the superlattice 230 may include further superlattice blocks such as at least one lower superlattice block 230L and/or at least one upper superlattice block 230U. Accordingly, forming of the superlattice 230 may include forming at least the first superlattice block 231 (step 406-1) and the second superlattice block 232 (step 406-2), but may optionally include forming further lower and/or upper superlattice blocks (represented by step 406-L and 406-U of FIG. 3).

Each superlattice block of the superlattice may be formed by a repetition of identical and consecutively formed superlattice units. As indicated in FIG. 1 for the first superlattice block 231, the superlattice block 231 consists of a stack of a number m of superlattice units 231-1, 231-2, ... 231-m, wherein m is 2 or greater. The second superlattice block 232 is formed on the upper main surface of the first superlattice block 231. The superlattice block 232 consists of a stack of a number n of superlattice units 232-1, 232-2, ... 232-n, wherein n is 2 or greater. The number of superlattice units may be the same or different among the superlattice blocks. For instance, the number n of superlattice units of the second superlattice block 232 may be equal to m or different from m.

Figure 2:
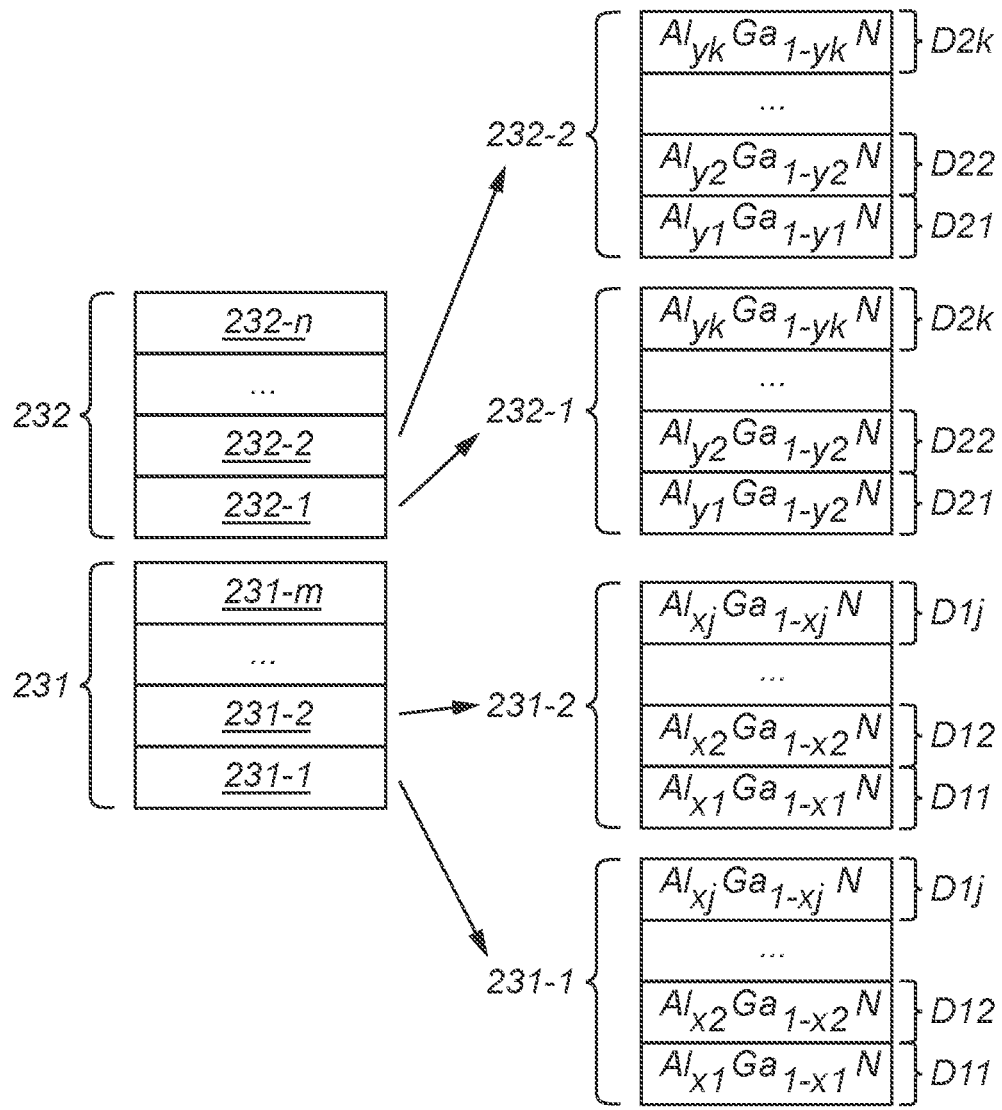
FIG. 2 shows a composition of superlattice units, accordingly to an example embodiment.

As shown in FIG. 2, each superlattice unit of the first superlattice 231 is formed of a stack or laminate of j layers (wherein j is 2 or greater) of AlGaN, wherein each of the layers of the stack have an aluminum content which is different from an aluminum content of an adjacent layer of the stack (i.e. $x[i-1] \neq xi \neq x[i+1]$, for $2 \leq i \leq j-1$). Optionally, each of the layers of the stack may have an aluminum content which is different from an aluminum content of each other layer of the stack (i.e. $x1 \neq x2 \neq \ldots xj$). The thicknesses $D1i$ of the $i^{th}$ layers of each superlattice unit 231-1, 231-2, ..., 231-m may as indicated in FIG. 2 be identical. Thus, the superlattice units 231-1, 231-2, ..., 231-m may have an identical/a same composition.

Each superlattice unit of the second superlattice 232 is formed of a stack or laminate of k layers (wherein k is 2 or greater) of AlGaN, wherein each of the layers of the stack have an aluminum content which is different from an aluminum content of an adjacent layer of the stack (i.e. $y[i-1] \neq yi \neq y[i+1]$, for $2 \leq i \leq k-1$). Optionally, each of the layers of the stack may have an aluminum content which is different from an aluminum content of each other layer of the stack (i.e. $y1 \neq y2 \neq \ldots \neq yk$). The thicknesses $D2i$ of the $i^{th}$ layers of each superlattice unit 232-1, 232-2, ..., 232-n may as shown in FIG. 2 be identical. Thus, the superlattice units 232-1, 232-2, ..., 232-n may have an identical/a same composition.

Each layer of the superlattice units of the superlattice blocks 231, 232 may be epitaxially grown using any of the techniques discussed on connection with the lower transition layer 220. Each layer of the superlattice units of the superlattice blocks 231, 232 may be formed with a thickness less than 100 nm.

The layers of the superlattice blocks 231, 232 may be formed as pseudomorphic layers (i.e. by forming each layer with a thickness less than the critical layer thickness). However, the superlattice 230 may also be formed to include one or more partially or fully strain relaxed layer (i.e. by forming the layer with a thickness greater than the critical layer thickness).

Within the above bounds, the compositions of the first and the second superlattice blocks 231, 232 are such that an average aluminum content of the second superlattice block 232 is greater than an average aluminum content of the first superlattice block 231. The average aluminum content of the second superlattice block 232 may be at least 1% greater than the average aluminum content of the first superlattice block 231. In other words the AL % of the second superlattice block 232 may be 1 percentage unit greater than the AL % of the first superlattice block 231.

The one or more further superlattice blocks 230L, 230U of the superlattice 230 generally presents a corresponding composition as the first and the second superlattice blocks 231, 232. A lower superlattice block 230L (if present) may present an average aluminum content which is greater than the average aluminum content of the first superlattice block 231. Meanwhile, an upper superlattice block 230U (if present) may present an average aluminum content which is less than the average aluminum content of the second superlattice block 232.

According to a further variation, the superlattice 230 may include a third superlattice block formed on the second superlattice block 232 and a fourth superlattice block formed on the third superlattice block. The third and fourth superlattice block may form a second "non-compressive stress inducing pair", on top of the first "non-compressive stress inducing pair" formed by the first and the second superlattice blocks 231, 232. Thus, the average aluminum content of the fourth superlattice block may be greater than the average aluminum content of the third superlattice block. The average aluminum content of the third superlattice block may be smaller than the average aluminum content of the second superlattice block. The superlattice 230 may include even further "non-compressive stress inducing pairs", such as a third pair. The third pair may include a fifth superlattice block formed on the fourth superlattice block and a sixth superlattice block formed on the fifth superlattice block, wherein an average aluminum content of the sixth superlattice block is greater than an average aluminum content of the fifth superlattice block and wherein the average aluminum content of the fifth superlattice block is smaller than the average aluminum content of the fourth superlattice block. It is contemplated that this scheme may be even further extended to include four, five or more of such "non-compressive stress inducing pairs".

The upper transition layer 240 is formed on and in contact with the upper main surface of the superlattice 230 (step 408 of FIG. 3). The upper transition layer 240 may be formed as a single layer with a uniform composition. For instance, the upper transition layer 240 may be an (Al)GaN layer having an Al content in the range of 0% to 20%. Alternatively, the upper transition layer 240 may be formed as a composite layer including two or more sub-layers of (Al)GaN with different compositions. The upper transition layer 240 may also include one or more layers of (InAlGa)N. The upper transition layer 240 may be formed with a (total) thickness of 1500 nm or less. The upper transition layer 240 may be formed to present a C-plane as an upper main surface. The upper transition layer 240 may be epitaxially grown using any of the techniques discussed on connection with the lower transition layer 220.

The III-N semiconductor channel layer 300 (hereinafter "the channel layer 300") may as shown be formed (step 410 of FIG. 3) on and in contact with the upper main surface of the buffer structure 200 (formed either by the upper main surface of the upper transition layer 240 or the upper main surface of the superlattice 230).

The channel layer 300 may be formed of $B_xIn_yAl_zGa_wN$ ($0 \leq x \leq 1$, $0 \leq y \leq 1$, $0 \leq z \leq 1$, $0 \leq w \leq 1$, and $x+y+z+w=1$). The channel layer 300 may be epitaxially grown by MOCVD using conventional group III element precursors, such as of TMIn and triethylboron (TEB), TMGa, TEGa, and TMAl, or by other conventional vapor phase deposition techniques. The channel layer may be grown to a total thickness in the range of 0.1 to 1 µm.

Subsequent to forming the channel layer 300, further layers and structures may be formed on the semiconductor structure in order to form a complete device. For instance, an $B_aIn_bAl_cGa_dN$ layer ($0 \leq a \leq 1$, $0 \leq b \leq 1$, $0 \leq c \leq 1$, $0 \leq d \leq 1$ and $a+b+c+d=1$) electron supply layer may be formed on the channel layer 300. An AlN spacer layer may be formed between the channel layer 300 and the electron supply layer. A cap layer, such as a GaN layer or $Si_3N_4$ layer, may be formed on top of the electron supply layer. The spacer layer, the electron supply layer and the cap layer may be formed using a same deposition technique as for the channel layer 300. Source, drain and gate electrodes may be formed on the electron supply layer (or the cap layer if present) in a conventional manner.

In addition to the above discussion concerning materials and composition of the layers of the buffer structure 200, it is possible to form the layers as layers doped by impurity atoms. For example, one or more of the lower transition layer 220, layers of the superlattice 230 and/or the upper transition layer 220 may be doped to a concentration of $1 \times 10^{18}$ (atom/cm$^3$) or greater. This may improve breakdown voltage of the buffer structure 200. The dopants/impurity atoms may be one or more species selected from the group consisting of C atoms, Fe atoms, Mn atoms, Mg atoms, V atoms, Cr atoms, Be atoms and B atoms. Dopants may be introduced by adding a source of the intended dopant species to the growth chamber during the epitaxial growth of the layer to be doped. For instance, carbon doping may be achieved by adding a carbon-source to the growth chamber, such as methane ($CH_4$), ethylene ($C_2H_4$), acetylene ($C_2H_2$), propane ($C_3H_8$) or iso-butane (i-$C_4H_{10}$).

FIG. 4a schematically shows a III-N semiconductor structure according to a first example. FIG. 4b shows the in situ wafer curvature and the post-epi wafer warp. The sharp spikes and short-range high frequency oscillations of the curves are artefacts of the measurement system. FIG. 4c shows the pre- and post-epi wafer warp measured along two orthogonal directions along the wafer.

The structure comprises: a SOI substrate 100 of 1.5 μm thick Si {111} bonded to a 1071 μm thick Si {100} handling wafer by a 1 μm thick oxide layer, a 200 nm thick AlN nucleation layer 210, a 50 nm $Al_{0.75}GaN$ lower transition layer 220, a superlattice 230 of: a 1.65 μm thick first superlattice block 231 formed by 50 repetitions of a superlattice unit of a [5 nm AlN/28 nm $Al_{0.15}GaN$] bilayer (corresponding to an average aluminum content AL %=28%), and a 1.5 μm thick second superlattice block 232 formed by 40 repetitions of a superlattice unit of a [10 nm AlN/28 nm $Al_{0.3}GaN$] bilayer (corresponding to an average aluminum content AL %=48%), a 1 μm thick carbon-doped GaN upper transition layer 240, and a 300 nm GaN channel layer 300.

As may be seen, by introducing a superlattice block with a higher average aluminum content AL % on top of another superlattice block, tensile stress can be introduced which lowers down the in situ curvature as well as the ex situ wafer warp (measured as peak-to-peak difference). As may be seen in the chart, the second superlattice block 232 is grown such that a temporal rate of change of the in situ curvature is less than 0. This is due to the average aluminum content of the second block 232 being greater than that of the first block 231. The chart also schematically indicates the in situ shape of the structure when the in situ curvature is positive (convex shape) and when the in situ curvature is negative (concave shape). The total buffer thickness is ~4.9 μm. As will be shown in the following, it may otherwise in alternative schemes be challenging to grow >4 μm thickness III-N structures without reaching the substrate plastic deformation limit.

FIG. 5a schematically shows a III-N semiconductor structure according to a second example. FIG. 5b shows the in situ wafer curvature. FIG. 5c shows the pre- and post-epi wafer warp measured along two orthogonal directions along the wafer. The structure comprises: a SOI substrate 100 of 1.5 μm thick Si {111} bonded to a 1071 μm thick Si {100} handling wafer by a 1 μm thick oxide layer, a 200 nm thick AlN nucleation layer 210, a 50 nm $Al_{0.75}GaN$ lower transition layer 220, a superlattice 230 of: a 1.65 μm thick first superlattice block 231 formed by 50 repetitions of a superlattice unit of a [5 nm AlN/28 nm $Al_{0.15}GaN$] bilayer (corresponding to an average aluminum content AL %=28%), and a 0.5 μm thick second superlattice block 232 formed by 15 repetitions of a superlattice unit of a [7 nm AlN/28 nm $Al_{0.15}GaN$] bilayer (corresponding to an average aluminum content AL %=32%), a 1.65 μm thick third superlattice block 233 formed by 50 repetitions of a superlattice unit of a [4 nm AlN/30 nm $Al_{0.1}GaN$] bilayer (corresponding to an average aluminum content AL %=20.6%), a 0.5 μm thick fourth superlattice block 234 formed by 15 repetitions of a superlattice unit of a [5 nm AlN/30 nm $Al_{0.1}GaN$] bilayer (corresponding to an average aluminum content AL %=22.9%), a 1 μm thick carbon-doped GaN upper transition layer 240, and a 400 nm GaN channel layer 300.

Thus, there are in total 4 superlattice blocks in the structure. By alternating the average aluminum content Al % in each superlattice block both compressive strain and tensile strain can be introduced which consequently increase or decrease the in situ wafer curvature at a relatively low value when growing a rather thick SL structure of ~4.3 um. The resulting max in situ curvature is then still below the limit for wafer plastic deformation for this structure of ~6 μm. The final wafer warp is at a much lower level compared with reference 1 which is only ~3 μm in thickness.

Figures 6A, 6B, 6C:
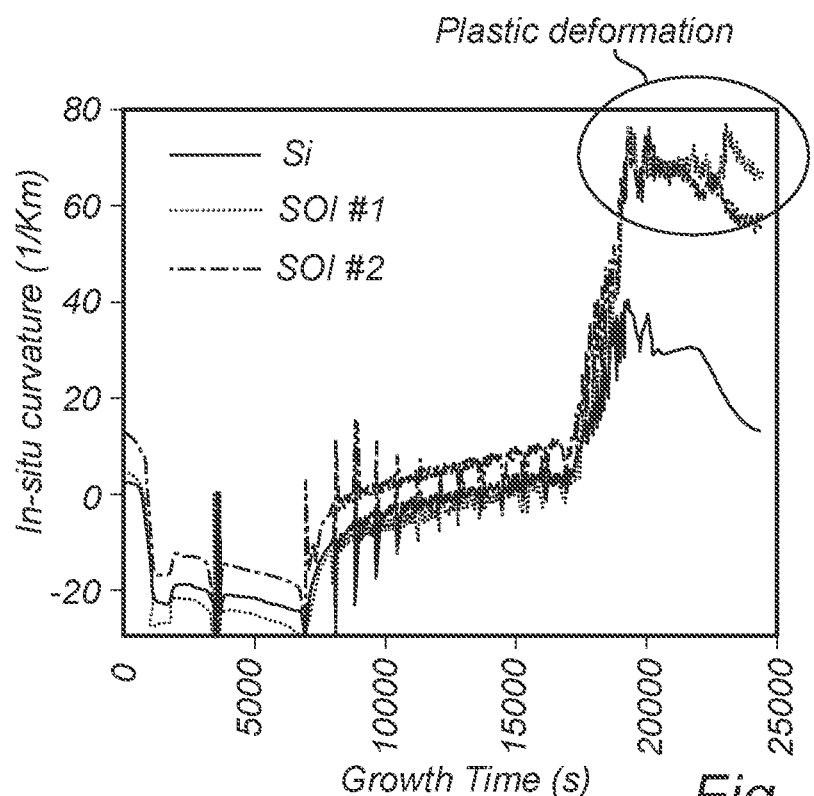
FIG. 6a is a III-N semiconductor structure, according to an example embodiment.
FIG. 6b shows an in situ wafer curvature, according to an example embodiment.
FIG. 6c shows the pre- and post-epi wafer warp measured along two orthogonal directions along the wafer.

FIGS. 6a, 6b, and 6c show a first comparative example of transferring a buffer that is designed for Si bulk substrate directly onto SOI substrate. FIG. 6a schematically shows a III-N semiconductor structure, FIG. 6b shows the in situ wafer curvature, and FIG. 6c shows the pre- and post-epi wafer warp measured along two orthogonal directions along the wafer. The SOI substrate 610 was of a same configuration as in the previous examples. The structure further comprised: a 200 nm AlN nucleation layer 620, a 40 nm $Al_{0.3}GaN$ lower transition layer 630, a superlattice 640 formed by 50 repetitions of a superlattice unit of a [5 nm AlN/28 nm $Al_{0.1}GaN$] bilayer, a 1 μm carbon-doped GaN channel layer 650, a 300 nm GaN layer 660, an 18 nm $Al_{0.175}GaN$ layer 670 and a 70 nm p-doped GaN layer 680.

As shown in FIGS. 6a, 6b, and 6c the total stack is ~3.3 μm. In situ wafer curvature and ex situ wafer warp are summarized for 2 runs. In each run ("#1" and "#2"), one SOI and one Si reference substrate were loaded into the reactor at the same time. One can see that the in situ wafer curvature of SOI substrates increase significantly compared with Si reference substrate. It reached a very high value of ~80 km$^{-1}$ for SOI substrates when the substrate deformed plastically (i.e. cracked). The ex situ wafer warp of SOI substrate is also much higher compared to the Si substrates.

FIGS. 7a, 7b, and 7c show a second comparative example indicating the challenges to grow thicker Epi layers using a conventional buffer scheme. In this example, a step-graded buffer of only ~2.8 μm was grown on SOI and Si substrates in the same run. FIG. 7a schematically shows a III-N semiconductor structure, FIG. 7b shows the in situ wafer curvature, and FIG. 7c shows the pre- and post-epi wafer warp measured along two orthogonal directions along the wafer. The SOI substrate 710 was of a same configuration as in the previous examples. The structure further comprised: a 200 nm AlN layer 720, a 300 nm $Al_{0.44}GaN$ layer 730, a 2 μm C-doped $Al_{0.08}GaN$ layer 740, a 300 nm GaN layer 750, a 12.5 nm $Al_{0.25}GaN$ layer 760, and a 70 nm p-doped GaN layer 770. In the chart of FIG. 7b, the pocket denotes the position of the wafer on the carrier during the epitaxial process. Again, the in-situ curvature of SOI substrate is higher than the Si substrates. Following the same buffer scheme but simply increasing the layer thickness, it will soon inevitably reach the in situ curvature limit for substrate plastic deformation. As the two standard (STD) Si have very similar curves, the table only shows a single warp value for STD Si.

In the above, the concepts have mainly been described with reference to a limited number of examples. However, as is readily appreciated by a person skilled in the art, other examples than the ones disclosed above are equally possible within the scope of the disclosure, as defined by the appended claims.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A III-N semiconductor structure comprising:
    a semiconductor-on-insulator substrate;
    a buffer structure comprising a superlattice including at least a first superlattice block, a second superlattice block formed on the first superlattice block, and an upper superlattice block formed above the second superlattice block, wherein:
        the first superlattice block includes a repetitive sequence of first superlattice units, each first superlattice unit including a stack of layers of AlGaN, wherein adjacent layers of the stack of layers have different aluminum content,
        the second superlattice block includes a repetitive sequence of second superlattice units, each second superlattice unit including a stack of layers of AlGaN, wherein adjacent layers of the stack of layers have different aluminum content,
        an average aluminum content of the second superlattice block is greater than an average aluminum content of the first superlattice block, and
        the aluminum content of the upper superlattice block is less than the average aluminum content of the second superlattice block; and
    a III-N semiconductor channel layer arranged on the buffer structure.

2. The semiconductor structure according to claim 1, wherein the superlattice of the buffer structure includes a plurality of superlattice blocks and wherein the first and the second superlattice blocks form an adjacent pair of superlattice blocks of the superlattice.

3. The semiconductor structure according to claim 1, wherein the superlattice includes a lower superlattice block formed below the first superlattice block and having an average aluminum content which is greater than the average aluminum content of the first superlattice block.

4. The semiconductor structure according to claim 1, wherein the superlattice includes a third superlattice block formed on the second superlattice block and a fourth superlattice block formed on the third superlattice block, wherein an average aluminum content of the fourth superlattice block is greater than an average aluminum content of the third superlattice block, and wherein the average aluminum content of the third superlattice block is smaller than the average aluminum content of the second superlattice block.

5. The semiconductor structure according to claim 1, wherein the semiconductor-on-insulator substrate includes a bottom wafer, a top semiconductor layer and an insulator layer intermediate the bottom wafer and the top semiconductor layer, and wherein a combined thickness of the buffer structure and the III-N semiconductor channel layer is greater than a thickness of top semiconductor layer.

6. The semiconductor structure according to claim 1, wherein the buffer structure includes an AlN nucleation layer formed on the semiconductor-on-insulator substrate.

7. The semiconductor structure according to claim 6, wherein the buffer structure further comprises a lower transition layer of (Al)GaN, wherein the superlattice is formed on the lower transition layer.

8. The semiconductor structure according to claim 1, wherein the buffer structure further comprises an upper transition layer of (Al)GaN formed on the superlattice.

9. A method for forming a III-N semiconductor structure, the method comprising:
    forming, on a semiconductor-on-insulator substrate, a buffer structure, wherein forming the buffer structure comprises:
        forming a superlattice including at least a first superlattice block, a second superlattice block on the first superlattice block, and an upper superlattice block above the second superlattice block, wherein:
            the first superlattice block is formed by epitaxially growing a repetitive sequence of first superlattice units, each first superlattice unit including a stack of layers of AlGaN, wherein adjacent layers of the stack of layers have different aluminum content,
            the second superlattice block is formed by epitaxially growing a repetitive sequence of second superlattice units, each second superlattice unit including a stack of layers of AlGaN, wherein adjacent layers of the stack of layers have different aluminum content,
            an average aluminum content of the second superlattice block is greater than an average aluminum content of the first superlattice block, and
            the aluminum content of the upper superlattice block is less than the average aluminum content of the second superlattice block; and
        epitaxially growing a III-N semiconductor channel layer on the buffer structure.

10. The method according to claim 9, wherein forming the superlattice includes forming a plurality of superlattice blocks and wherein the first and the second superlattice blocks form an adjacent pair of superlattice blocks of the superlattice.

11. The method according to claim 9, wherein the semiconductor-on-insulator substrate includes a bottom wafer, a top semiconductor layer and an insulator layer intermediate the bottom wafer and the top semiconductor layer, and wherein the buffer structure and the III-N semiconductor channel layer are formed with a combined thickness greater than a thickness of top semiconductor layer.

12. The method according to claim 9, wherein the second superlattice block is grown such that a temporal rate of change of an in situ curvature of the second superlattice block is less than or equal to zero.

13. The method according to claim 9, wherein the superlattice is grown such that an at least partial strain relaxation occurs between at least one adjacent pair of layers of the superlattice.

* * * * *